United States Patent [19]
Findeis et al.

[11] Patent Number: 6,051,119
[45] Date of Patent: Apr. 18, 2000

[54] PLATING STRUCTURE FOR A PIN GRID ARRAY PACKAGE

[75] Inventors: Paul F. Findeis, Glenham, N.Y.; Kenneth R. Idler, Blairstown, N.J.; Minkailu A. Jalloh, Poughkeepsie, N.Y.; Thomas A. Kelly, Blairstown, N.J.; Emanuele F. Lopergolo, Marlboro, N.Y.

[73] Assignees: International Business Machines Corporation, Armonk, N.Y.; General Wire & Stamping Company, Incorporated, Randolph, N.J.

[21] Appl. No.: 09/005,873

[22] Filed: Jan. 12, 1998

[51] Int. Cl.[7] ..................................................... C25D 17/04
[52] U.S. Cl. ................................ 204/297 W; 204/297 R; 205/78; 205/122; 29/825
[58] Field of Search ................. 205/78, 122; 204/297 R, 204/297 W; 29/825

[56] References Cited

U.S. PATENT DOCUMENTS

| | | | |
|---|---|---|---|
| 4,949,455 | 8/1990 | Nakamura et al. | 205/122 |
| 5,022,976 | 6/1991 | Röll et al. | 204/297 R |
| 5,087,331 | 2/1992 | Röll et al. | 205/118 |
| 5,342,992 | 8/1994 | Noto | 174/52.4 |
| 5,516,416 | 5/1996 | Canaperi et al. | 205/78 |
| 5,580,432 | 12/1996 | Shibata et al. | 204/297 R |
| 5,869,139 | 2/1999 | Biggs et al. | 205/122 |

*Primary Examiner*—Bruce F. Bell
*Attorney, Agent, or Firm*—Ira D. Blecker

[57] ABSTRACT

Disclosed is a plating structure including a substrate having a plurality of pins to be plated and a metallic plating screen having a plurality of apertures, wherein each of the apertures has at least two tabs spaced apart from each other, wherein the metallic plating screen is placed over the pins so that at least two pins penetrate each aperture, each of the pins contacting a tab of the aperture. Also disclosed is a method of electrolytically plating a plurality of pins utilizing the above metallic plating screen.

18 Claims, 4 Drawing Sheets

PLATING STRUCTURE FOR A PIN GRID ARRAY PACKAGE

BACKGROUND OF THE INVENTION

This invention relates generally to a plating structure and a method for manufacturing pin grid array packages and, more particularly relates to the plating of pins on pin grid array packages using a removable metallic plating screen.

A common ceramic package for electronic applications is the pin grid array package wherein pins provide the inputs/outputs to the next level of packaging. Electroplating of the pins is employed to provide the pins with enhanced solderability, conductivity, and/or immunity to corrosion.

It is necessary to electrically short all of the pins during electroplating. This may be accomplished by shorting the pins internal to the ceramic package. As this is often impractical, the pins are usually electrically shorted external to the ceramic package by any of various means.

With the increasing complexity of ceramic packages that includes a large number of densely situated pins to be plated, the task of electrically shorting all of the pins becomes more complicated since any apparatus that contacts (and electrically shorts) all of the pins must necessarily restrict the flow of the electrolyte, thereby adversely affecting the plating of the pins.

Noto U.S. Pat. No. 5,342,992, the disclosure of which is incorporated by reference herein, discloses an electrically conductive plate that contacts all of the pins. Contact with the plate is provided by pin-clasp contacts. A difficulty with the disclosed apparatus is that the muliple pin-clasps make the plate difficult to remove while if there is only one pin-clasp, contact with the pin may not occur if the pin is bent.

Shibata et al. U.S. Pat. No. 5,580,432, the disclosure of which is incorporated by reference herein, discloses a plating jig for plating pin grid arrays which is placed over the pins and then laterally moved to cause a force fit between the plating jig and the pins.

Canaperi et al. U.S. Pat. No. 5,516,416, the disclosure of which is incorporated by reference herein, discloses an apparatus for plating pin grid arrays wherein the pins are electrically shorted by being pressed against an electrically conductive foil. This apparatus works well except that when the number of pins increases, the electrolyte becomes depleted before it can reach the centrally located pins.

Roll et al. U.S. Pat. Nos. 5,022,976 and 5,087,331, the disclosures of which are incorporated by reference herein, disclose a plating jig on which is clipped the pin grid array package. The plating jig comprises metal bars or pegs which make contact with the pins. According to the teachings of this patent, the pins must first be bent before being clipped to the plating jig.

It is a purpose of the present invention to provide an apparatus and method for electroplating pin grid array pins that is an improvement of the prior art.

It is a further purpose of the present invention to provide an apparatus and method for electroplating pin grid array pins that electrically shorts all of the pins.

It is yet another purpose of the present invention to provide an apparatus and method for electroplating pin grid array pins that utilizes a metallic screen that contacts all of the pins.

These and other purposes of the present invention will become more apparent after referring to the following description in conjunction with the accompanying drawings.

BRIEF SUMMARY OF THE INVENTION

According to a first aspect of the invention, there is disclosed a plating structure comprising:

a substrate having a plurality of pins to be plated; and a metallic plating screen having a plurality of apertures, wherein each of the apertures has at least two tabs spaced apart from each other, wherein the metallic plating screen is placed over the pins so that at least two pins penetrate each aperture, each of said pins contacting a tab of said aperture.

According to a second aspect of the invention, there is disclosed a method of electrolytically plating a plurality of pins utilizing a metallic plating screen having a plurality of apertures, wherein each of the apertures has at least two tabs spaced apart from each other, comprising the steps of:

placing the metallic plating screen over the pins so that the plurality of pins penetrates the plurality of apertures with at least two pins penetrating each aperture, each of the pins contacting at least one tab, the metallic plating screen electrically contacting each of the plurality of pins;

placing the metallic plating screen and the pins in a plating solution; and applying an electrical current to the metallic plating screen and to the plurality of pins, thereby causing the plurality of pins to become plated by said plating solution.

BRIEF DESCRIPTION OF THE DRAWINGS

The features of the invention believed to be novel and the elements characteristic of the invention are set forth with particularity in the appended claims. The Figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE INVENTION

Figure 1:
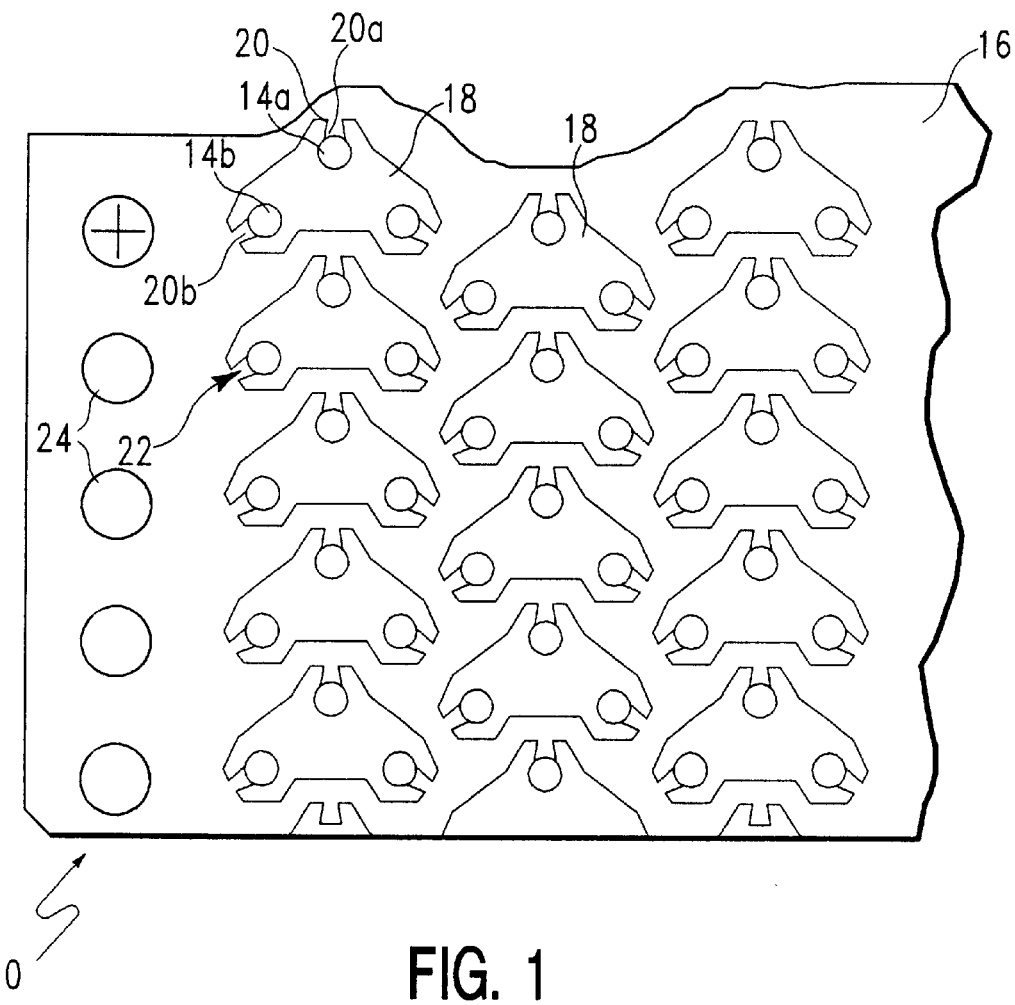
FIG. 1 is a top view of a first embodiment of the plating structure according to the present invention.
Figure 2:
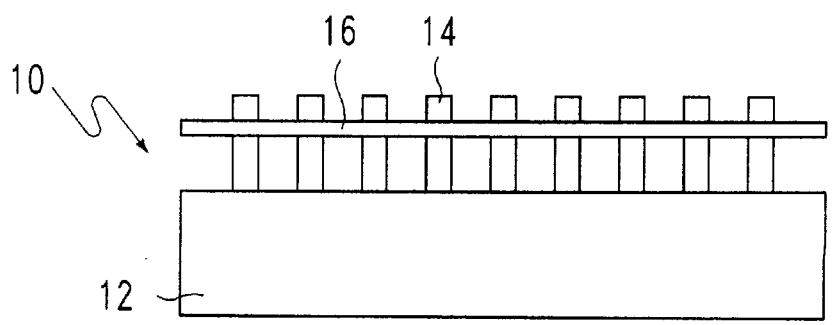
FIG. 2 is a side view of a first embodiment of the plating structure according to the present invention.

Referring now to the Figures in detail, and particularly referring to FIGS. 1 and 2, there is shown a metallic plating structure, generally indicated by 10, according to the present invention. The plating structure comprises a substrate 12 having a plurality of input/output (I/O) pins 14 to be plated. The substrate 12 may be any dielectric material that is commonly used to make electronic substrates. Some examples of materials are ceramics, glass-ceramics and organics, to name a few.

The substrate by design is not a conductor of electricity so that in order to plate all of the pins, it is necessary to electrically connect all of the pins in some manner.

According to the present invention, a metallic plating screen 16 is utilized to electrically connect all of the pins 14. In FIG. 1, substrate 12 is hidden by the metallic plating screen 16. The metallic plating screen 16 has a plurality of apertures 18 wherein each of the apertures 18 has at least two tabs 20 spaced apart from each other. As shown in FIG. 1, tab 20a is spaced apart from tab 20b. The metallic plating screen 16 is placed over the pins 14 so that at least two pins 14 penetrate each aperture 18 with each of the pins 14 contacting a tab 20 of the aperture. As shown in FIG. 1, pin 14a contacts tab 20a while pin 14b contacts tab 20b.

The present inventors have found it advantageous to place the metallic plating screen 16 over the pins 14 by using a modified press in which the metallic plating screen 16 is pressed onto the pins 14. Alternatively, the metallic plating screen 16 may be placed over the pins 14 by hand.

An advantage of the present invention is that the aperture 18 is open to allow the free flow of electrolyte (not shown). A further advantage of the present invention is that the metallic plating screen 16 captures two or more pins 14 at a time which allows for efficient use of space and effective contact between the pins 14 and metallic plating screen 16. The design of the aperture 18 is such that slightly bent pins 14 will also be captured by the aperture 18 and tabs 20.

The metallic plating screens according to the present invention may be made by a die stamping process. In this process, a continuous sheet of metallic material is fed into a die stamping apparatus for forming of the apertures and tabs. Carrier holes, for example carrier holes 24 shown in FIG. 1 in metallic plating screen 16, are used to feed the continuous sheet of metallic material into the die stamping apparatus. After die stamping, the continuous sheet of metallic material is cut into convenient sizes, for example, a size that matches the dimensions of the pin array of substrate 12.

It is preferred that the metallic plating screens according to the present invention are thin and flexible so as to be easily placed over the I/O pins and be easily removable. Further, by using as little material as possible for the metallic plating screens and by producing them in an efficient manner, the metallic plating screens become economical to manufacture. Too, the metallic plating screens may be disposed of after each use if desired or reused a limited number of times due to their economical cost.

The material comprising the metallic plating screen should also be inert to the plating bath so that the metallic plating screen does not deteriorate during immersion in the plating bath. The present inventors have found that 0.003 inches thick 300 series stainless steel works fine for the inventors' application. Other materials should also be acceptable as a person skilled in the art would appreciate.

Figure 3:
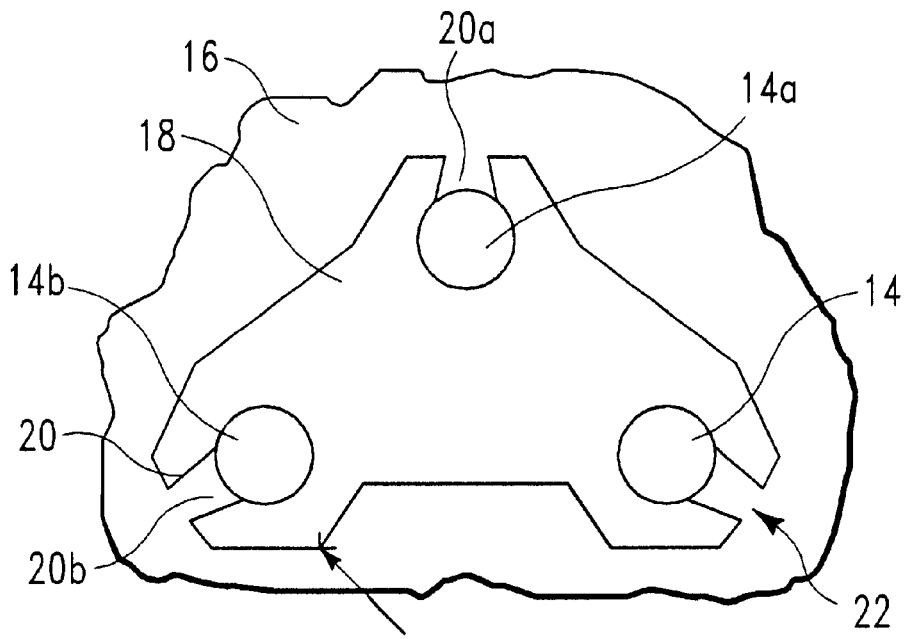
FIG. 3 is an enlarged view of an aperture of the first embodiment of the metallic plating screen.

The embodiment of metallic plating screen 16 shown in FIG. 1 is one preferred embodiment of the present invention. For convenience, the aperture 18 shown in FIG. 1 is enlarged and shown in FIG. 3. The aperture 18 shown in FIGS. 1 and 3 is triangular-shaped and has at least one tab proximately located at each vertex 22 of the aperture 18.

Figure 4:
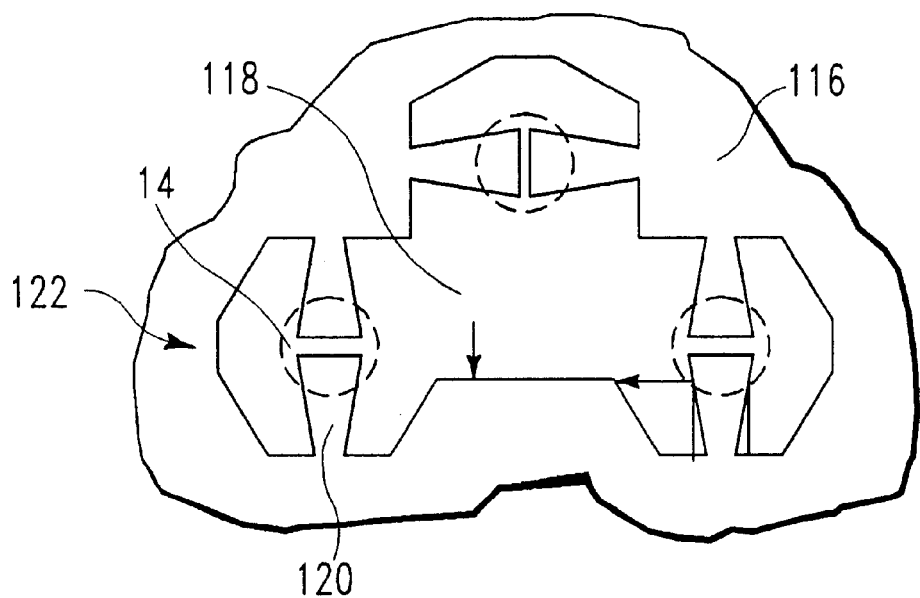
FIG. 4 is an enlarged view of an aperture of a second embodiment of the metallic plating screen according to the present invention.

There may be more than one tab at one or more, or all, of the apertures. Referring now to FIG. 4, there is shown a second embodiment of the metallic plating screen 116 according to the present invention. Aperture 118 has two tabs 120 located at each vertex 122 of the aperture 118. Pins 14 are shown in phantom.

The metallic plating screen 116 has the advantage over metallic plating screen 16 of being able to capture pins 14 which are bent to a greater degree. On the other hand, the single tab design of the metallic plating screen 16 makes it easier to remove the metallic plating screen 16 from the plurality of pins 14.

Figure 5:
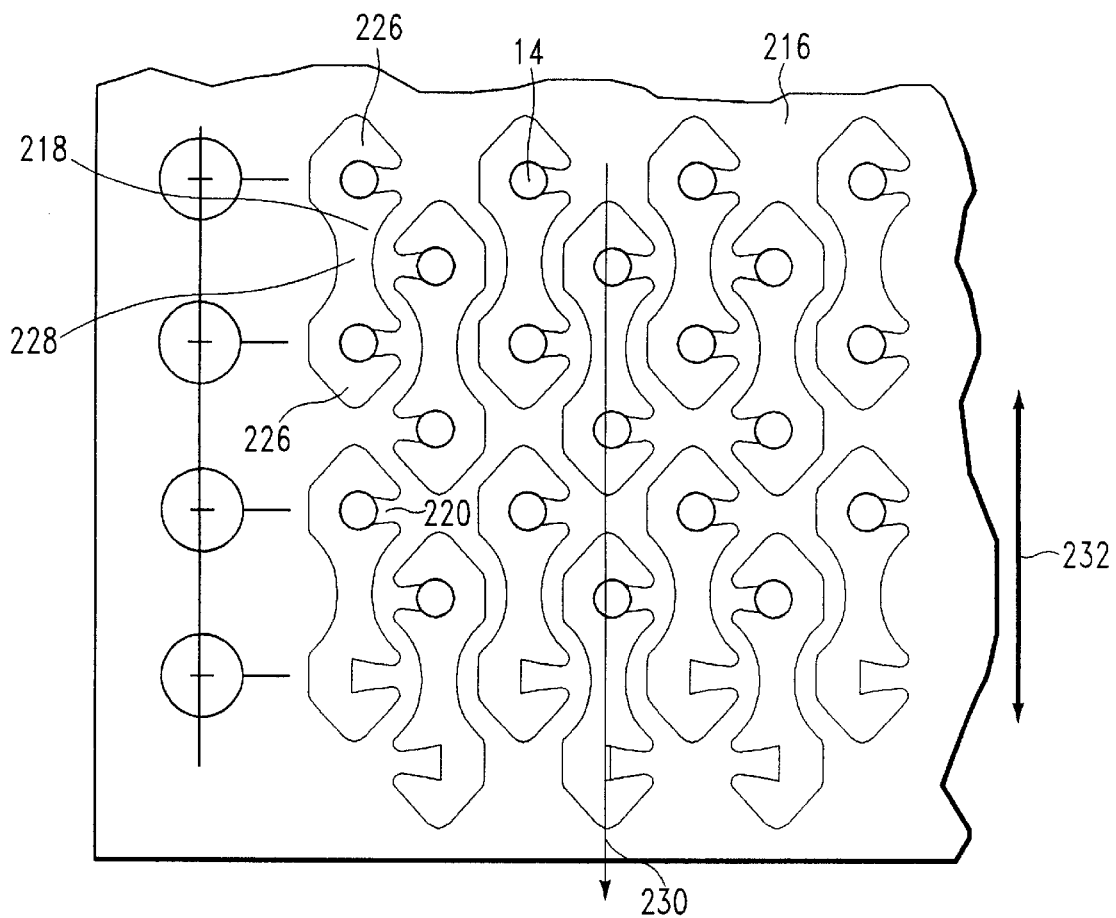
FIG. 5 is a top view of a third embodiment of the metallic plating screen according to the present invention.
Figure 6:
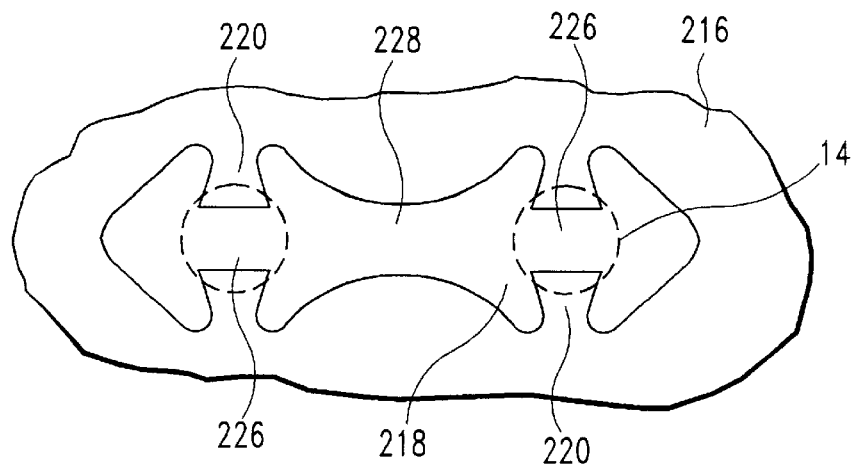
FIG. 6 is an enlarged view of an aperture of the third embodiment of the metallic plating screen.

A third embodiment of the metallic plating screen according to the present invention is shown in FIG. 5. An enlarged view of the aperture 218 is shown in FIG. 6 where the pins are shown in phantom. Metallic plating screen 216 has apertures 218 which are essentially "dog-bone" shaped. That is, aperture 218 has two aperture portions 226 separated by a smaller aperture portion 228. Each of the aperture portions 226 contains a tab 220 for contacting a pin 14. The tabs 220 are on the same side of the aperture 218.

Figure 7:
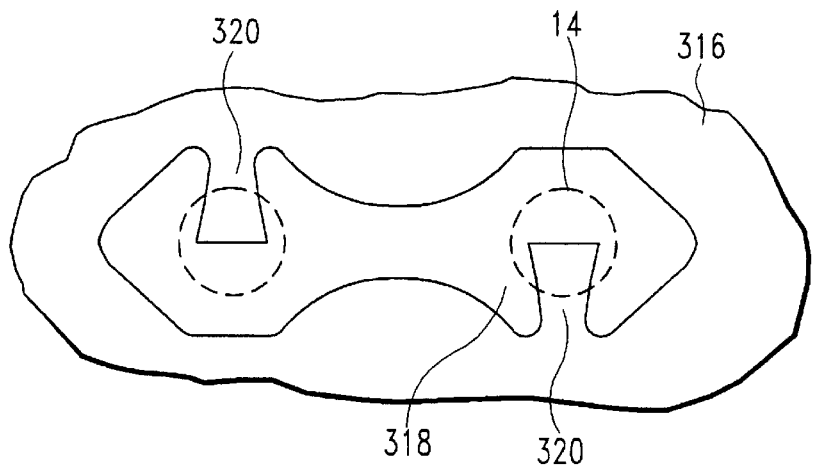
FIG. 7 is an enlarged view of an aperture of a fourth embodiment of the metallic plating screen according to the present invention.

A fourth embodiment of the metallic plating screen according to the present invention is shown in FIG. 7. Metallic plating screen 316 shown in FIG. 7 is identical to metallic plating screen 216 shown in FIGS. 5 and 6 except that the tabs 320 in aperture 318 of metallic plating screen 316 are on opposite sides of the aperture 318. Placing tabs 320 on opposite sides of the aperture 318 makes a more effective design for contacting the pins 14 (shown in phantom).

Figure 8:
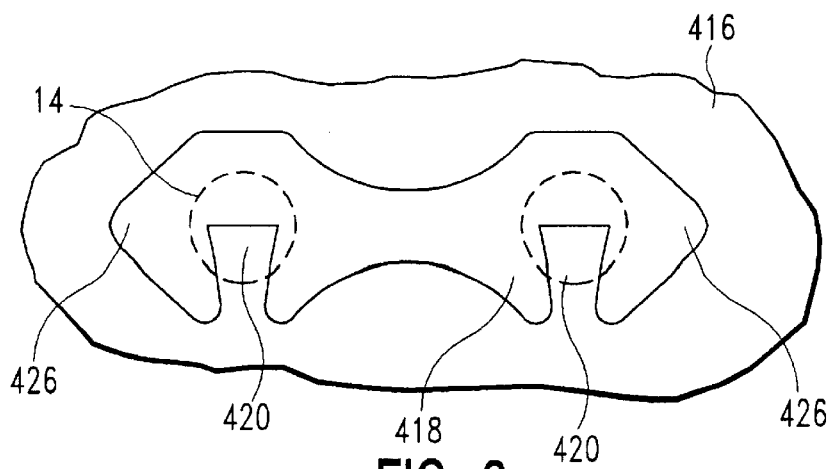
FIG. 8 is an enlarged view of an aperture of a fifth embodiment of the metallic plating screen according to the present invention.

A fifth embodiment of the metallic plating screen according to the present invention is shown in FIG. 8. The metallic plating screen 416 is similar to the embodiments of the metallic plating screens 216 and 316 discussed earlier except that metallic plating screen 416 has a plurality of tabs 420 in each portion 426 of aperture 418. Pins 14 are shown in phantom.

A feature common to the plating screens and similar devices of the prior art is that when the plating screen is removed, the tabs that make good electrical contact with the I/O pins also can damage the plating when the plating screen is removed. The embodiments of the present invention minimize the damage that can be caused by removal of the plating screen by the configuration of the apertures and placing of the tabs.

Referring now back to FIG. 5, a particularly preferred feature common to the embodiments of the metallic plating screens 216, 316, 416 will be discussed which minimizes to the greatest extent the damage that can be caused by removal of the metallic plating screen. For clarity, this feature will be discussed only with respect to the embodiment of the metallic plating screen 216 shown in FIG. 5 but it should be understood that it is equally applicable to the embodiments of metallic plating screens 316, 416 as well. The two aperture portions 226 and smaller aperture portion 228 of aperture 218 form an elongated aperture or "dog-bone" shaped aperture 218 as alluded to earlier. Each of the elongated apertures 218 are oriented in the same direction 230 to form rows of elongated apertures 218. Preferably, each tab 220 in each elongated aperture 218 is oriented so as to be approximately perpendicular to the direction of orientation 230 of the elongated apertures. The advantages of these embodiments will decrease the more the tabs 220 vary from being perpendicular to direction of orientation 230 while, on the other hand, the tabs 220 need not be exactly perpendicular to be advantageous. By orienting the apertures 218 in such a manner, the metallic plating screen 216 may be peeled off in the direction of arrows 232 without adversely "nicking" the plating on the pins 14. Thus, the orientation of the metallic plating screen 216 as just described allows removal of the metallic plating screen 216 without damaging, or at least extremely minimizing any damage to, any of the pins.

Also provided according to the present invention is a method of electrolytically plating a plurality of pins utilizing a metallic plating screen having a plurality of apertures, wherein each of the apertures has at least two tabs spaced apart from each other. The metallic plating screen may be of the metallic plating screens discussed previously.

According to the method, a metallic plating screen is placed over the pins so that the plurality of pins penetrates the plurality of apertures with at least two pins penetrating each aperture. Each of the pins contacts at least one tab of the metallic plating screen. The metallic plating screen thus electrically contacts each of the plurality of pins.

Next, the metallic plating screen and the pins are placed in a plating solution.

Lastly, an electrical current is applied to the metallic plating screen and to the plurality of pins, thereby causing the plurality of pins to become plated by said plating solution.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. A plating structure comprising:

a substrate having a plurality of pins to be plated; and a metallic plating screen having a plurality of apertures, wherein each of the apertures has at least two tabs spaced apart from each other, wherein the metallic plating screen is placed over the pins so that at least two pins penetrate each aperture, each of said pins contacting a tab of said aperture.

2. The plating structure of claim 1 wherein each of the apertures is triangular-shaped and has at least one tab proximately located at each vertex of each of the apertures.

3. The plating structure of claim 2 wherein the metallic plating screen has a plurality of tabs located proximate to at least one vertex of the apertures.

4. The plating structure of claim 2 wherein the metallic plating screen has a plurality of tabs located proximate to each vertex of the apertures.

5. The plating structure of claim 1 wherein each of the apertures consists of two aperture portions separated by a smaller aperture portion, each of the two aperture portions having at least one tab.

6. The plating structure of claim 5 wherein each of the two aperture portions has a plurality of tabs.

7. The plating structure of claim 5 wherein the two aperture portions and smaller aperture portion form an elongated aperture and each elongated aperture is oriented in the same direction to form rows of elongated apertures.

8. The plating structure of claim 7 wherein each tab in each elongated aperture is perpendicular to the direction of orientation of the elongated apertures.

9. The plating structure of claim 1 wherein the metallic plating screen is thin and flexible.

10. A method of electolytically plating a plurality of pins utilizing a metallic plating screen having a plurality of apertures, wherein each of the apertures has at least two tabs spaced apart from each other, comprising the steps of:

placing the metallic plating screen over the pins so that the plurality of pins penetrates the plurality of apertures with at least two pins penetrating each aperture, each of the pins contacting at least one tab, the metallic plating screen electrically contacting each of the plurality of pins;

placing the metallic plating screen and the pins in a plating solution; and applying an electrical current to the metallic plating screen and to the plurality of pins, thereby causing the plurality of pins to become plated by said plating solution.

11. The method of claim 10 wherein each of the apertures is triangular-shaped and has at least one tab proximately located at each vertex of each of the apertures.

12. The method of claim 11 wherein the metallic plating screen has a plurality of tabs located proximate to at least one vertex of the apertures.

13. The method of claim 11 wherein the metallic plating screen has a plurality of tabs located proximate to each vertex of the apertures.

14. The method of claim 10 wherein each of the apertures consists of two aperture portions separated by a smaller aperture portion, each of the two aperture portions having at least one tab.

15. The method of claim 14 wherein each of the two aperture portions has a plurality of tabs.

16. The method of claim 14 wherein the two aperture portions and smaller aperture portion form an elongated aperture and each elongated aperture is oriented in the same direction to form rows of elongated apertures.

17. The method of claim 16 wherein each tab in each elongated aperture is perpendicular to the direction of orientation of the elongated apertures.

18. The method of claim 10 wherein the metallic plating screen is thin and flexible.

* * * * *